United States Patent

Fabri

[11] 4,232,272
[45] Nov. 4, 1980

[54] FEEDBACK-STABILIZED MULTISTAGE FREQUENCY-SELECTIVE AMPLIFIER

[75] Inventor: Bruno Fabri, Turin, Italy

[73] Assignee: CSELT - Centro Studi e Laboratori Telecomunicazioni S.p.A., Turin, Italy

[21] Appl. No.: 956,441

[22] Filed: Nov. 1, 1978

[30] Foreign Application Priority Data

Nov. 2, 1977 [IT] Italy .................. 69446 A/77

[51] Int. Cl.³ .............................................. H03F 3/191
[52] U.S. Cl. .................................... 330/294; 330/297; 330/302; 330/310
[58] Field of Search ............... 330/294, 297, 176, 185, 330/192, 302, 310

[56] References Cited

U.S. PATENT DOCUMENTS 3,717,820  2/1973  Garcia et al. ................... 330/294 X

*Primary Examiner*—James B. Mullins
*Attorney, Agent, or Firm*—Karl F. Ross

[57] ABSTRACT

An amplifier having a high gain in a selected frequency band, e.g. for the preferential amplification of a pilot oscillation, consists of a plurality of cascaded stages each comprising an active component, a coupling network and a negative-feedback network. The coupling and feedback networks are alternately connected in a series circuit between a signal input and a signal output, each of these networks (with the possible exception of those associated with the first stage) comprising a damped parallel-resonant circuit with an inductive branch forming a low-ohmic path for direct current. Each active component has an input electrode connected through a stabilizing resistor to the junction of the associated coupling and feedback networks, its output electrode being tied to the downstream end of the corresponding feedback network. Operating current is supplied to the active component of the last stages through a choke connected directly to its output electrode, the output electrodes of the preceding stage receiving such operating current from the choke via some of the series-connected networks.

6 Claims, 1 Drawing Figure

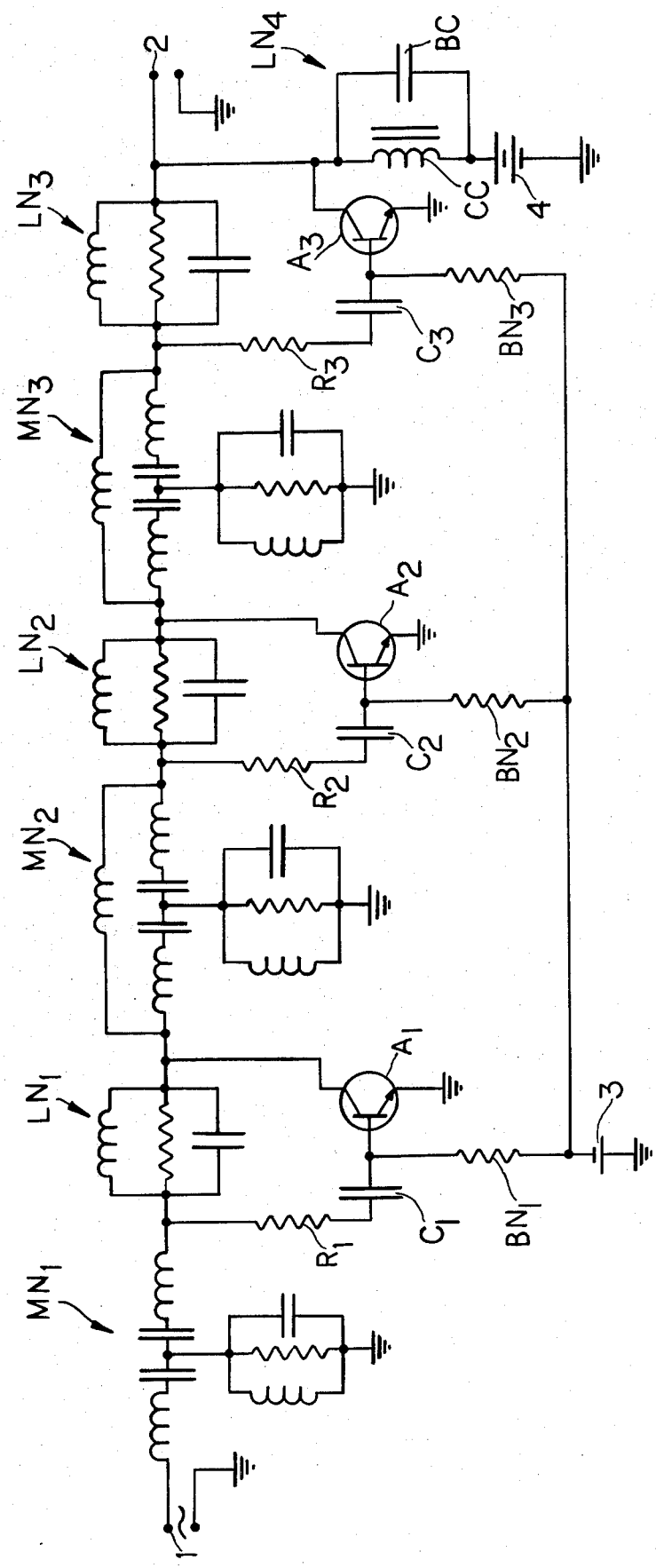

FEEDBACK-STABILIZED MULTISTAGE FREQUENCY-SELECTIVE AMPLIFIER

FIELD OF THE INVENTION

My present invention relates to a feedback-stabilized amplifier of the multistage type designed for the selective amplification of signals within a predetermined frequency band along with substantial attenuation of all frequencies outside that band.

BACKGROUND OF THE INVENTION

Selective amplification can be achieved by the use of one or more amplifier stages followed and/or preceded by passive filters with a suitable band-pass characteristic. If such a filter preceded a wide-band amplifier, the latter may generate considerable noise outside the selected range. If the amplifier is followed by the filter, it may be overloaded by out-of-band signals which could result in saturation and undesirable cross-modulation products. The use of two highly selective filters, upstream and downstream of the amplifier or a stage thereof, is costly and may lead to loss of selectivity due to deviations between the pass-band characteristics of these filters.

In the case of multistage amplifiers of this type, there is also the problem of supplying operating current to the several stages from a d-c source with minimum power loss and signal distortion. Thus, supplying the operating current to each stage through an individual resistor involves considerable energy dissipation whereas the use of choke coils for this purpose introduces parasitic capacitances, e.g. between the turns of the coil.

OBJECTS OF THE INVENTION

The general object of my present invention is to provide an improved frequency-selective multistage amplifier, stabilized by negative feedback, which avoids the aforestated drawbacks.

A more particular object is to provide means in such an amplifier for efficiently supplying operating current to the several stages thereof.

SUMMARY OF THE INVENTION

In accordance with my present invention, a plurality of coupling networks and a like plurality of partly inductive feedback networks are alternately inserted in a series chain between a signal-input terminal and a signal-output terminal to form a number of network pairs each associated with a respective amplifier stage. The active component of each stage, i.e. a transistor or a vacuum tube, has an input electrode connected to a junction of the associated coupling and feedback networks, an output electrode connected to a downstream end of the associated feedback, and a common electrode connected to one pole (usually grounded) of a d-c power supply whose other pole is connected to a downstream end of the aforementioned network chain proximal to the signal-output terminal. Within each network pair, the coupling network has a lower impedance than the associated feedback network for signal frequencies lying within the selected band. At least the coupling and feedback networks downstream of the first stage have inductive branches which form a continuous low-resistance path for direct current from the supply to the output electrodes of all active components.

Thus, the operating current is fed to the several amplifier stages in counterflow to the incoming signals so that its intensity progressively increases from the first stage to the last, as does the amplification of the signals.

If the active component is a transistor of the junction or the field-effect type, its output electrode is the collector or the drain, its input electrode is the base or the gate, and its common electrode is the emitter or the source. In the case of a vacuum tube these electrodes are, respectively, the plate, the control grid and the cathode.

BRIEF DESCRIPTION OF THE DRAWING

The above and other features of my invention will now be described in detail with reference to the accompanying drawing the sole FIGURE of which shows a circuit diagram of my improved frequency-selective amplifier.

SPECIFIC DESCRIPTION

The amplifier shown in the drawing includes, by way of example, three cascaded stages each comprising an active component $A_1$, $A_2$, $A_3$ illustrated as a junction transistor. Associated with each of these stages is a network pair composed of one of three coupling networks $MN_1$, $MN_2$, $MN_3$ and one of three negative-feedback networks $LN_1$, $LN_2$, $LN_3$. These coupling and feedback networks are interconnected, in interleaved relationship, in a series chain extending between a signal-input terminal 1 and a signal-output terminal 2.

The several active components $A_1$-$A_3$ have grounded common electrodes (emitters) and have output electrodes (collectors) tied to the downstream ends of respective feedback networks $LN_1$-$LN_3$. Their input electrodes (bases) are connected, via respective blocking capacitors $C_1$, $C_2$, $C_3$ in series with stabilizing resistors $R_1$, $R_2$, $R_3$, to the junctions of the associated feedback networks $LN_1$-$LN_3$ with the corresponding coupling networks $MN_1$-$MN_3$. Biasing voltages are supplied to the transistor bases from a source 3, shown as a battery, by way of respective resistors $BN_1$, $BN_2$, $BN_3$ which of course could be made adjustable.

Operating current is fed to the collectors of the several stages from a d-c supply 4, also shown as a battery, through a circuit $LN_4$ comprising a choke coil CC which may be tuned by a bypass condenser BC to antiresonance in the selected frequency range. Circuit $LN_4$ is tied directly to the collector of transistor $A_3$ as well as to the output end of the network chain $MN_1$-$MN_3$, $LN_1$-$LN_3$ shown to be directly connected to terminal 2. If desired, however, a further coupling network (not shown) could be inserted between that chain and terminal 2 for the purpose of output-impedance matching.

Feedback networks $LN_1$-$LN_3$ are designed as damped parallel-resonant filters and are each provided with an inductive branch, as are the coupling networks $MN_2$ and $MN_3$. Thus, direct current from supply battery 4 can flow with little attenuation to the collectors of the first-stage and second-stage transistors $A_1$ and $A_2$. Coupling networks $MN_1$-$MN_3$ are damped band-pass filters, the bridging inductance being omitted in the case of the first network $MN_1$ which serves only for input-impedance matching and need not form a low-resistance path for direct current unless it were desired to energize other components upstream of input terminal 1 with power from battery 4.

Networks $MN_1$-$MN_3$ and $LN_1$-$LN_3$ have relatively low and relatively high impedances, respectively, for signal frequencies within the band to be selectively amplified; these impedances may be designated $Z_1'$, $Z_2'$, $Z_3'$ for networks $MN_1$, $MN_2$, $MN_3$ and $Z_1''$, $Z_2''$, $Z_3''$ for networks $LN_1$, $LN_2$, $LN_3$. With transistors $A_1$–$A_3$ having a high gain approaching infinity (in the ideal case) so that the currents traversing the resistors $R_1$–$R_3$ may be considered negligible, the overall amplifier is given by $$\frac{Z_1' \cdot Z_2' \cdot Z_3'}{Z_1'' \cdot Z_2'' \cdot Z_3''}.$$

Resistors $R_1$–$R_3$, designed to prevent spontaneous oscillations, and capacitors $C_1$–$C_3$, which serve only to block the flow of direct current, do not appear in this formula.

In a specific instance, the signal to be amplified is a pilot oscillation monitoring the performance of a repeater in a transmission line upstream of inpur terminal 1. With the improved amplifier here disclosed, the need for expensive crystal-controlled filters tuned to the frequency of this pilot oscillation has been eliminated.

It should be noted that the input and output ends of all the series-connected networks $MN_1$–$MN_3$, $LN_1$–$LN_3$ are effectively insulated from ground for direct current, except to the extent that amplifier stages $A_1$–$A_3$ become conductive.

I claim:

1. A feedback-stabilized frequency-selective amplifier comprising:
   - a plurality of cascaded amplification stages each including an active component with an input electrode, an output electrode and a common electrode;
   - a plurality of coupling networks and a like plurality of feedback networks alternately inserted in a series chain between a signal-input terminal and a signal-output terminal, said input electrode of each active component being connected to a junction of a coupling network and a partly inductive feedback network of said chain in a network pair respectively associated therewith, said output electrode of each active component being connected to a downstream end of the associated feedback network; and
   - a supply of direct current connected between the common electrodes of all active components and a downstream end of said chain proximal to said signal-output terminal for feeding operating power to said stages, said coupling networks having lower impedances than the associated feedback networks for signal frequencies lying within a predetermined band, at least the coupling and feedback networks downstream of the first of said stages having inductive branches conductively interconnected at their junctions with formation of a continuous low-resistance path for direct current from said supply to the output electrodes of all active components.

2. An amplifier as defined in claim 1, further comprising a series inductance inserted between said supply and said chain.

3. An amplifier as defined in claim 1 or 2, further comprising a source of biasing voltage connected between said common and input electrodes of each active component.

4. An amplifier as defined in claim 3, further comprising a blocking capacitor inserted between said input electrode of each of said stages and the junction of the associated network pair.

5. An amplifier as defined in claim 4, further comprising a stabilizing resistor in series with said blocking capacitor.

6. An amplifier as defined in claim 1 or 2 wherein said feedback networks are damped parallel-resonant circuits.

* * * * *